(12) United States Patent
Campidelli et al.

(10) Patent No.: US 10,705,115 B2
(45) Date of Patent: Jul. 7, 2020

(54) METHOD AND APPARATUS FOR POSITIONING A MICRO- OR NANO-OBJECT UNDER VISUAL OBSERVATION

(71) Applicants: COMMISSARIAT A L'ENERGIE ATOMIQUE ET AUX ENERGIES ALTERNATIVES, Paris (FR); CENTRE NATIONAL DE LA RECHERCHE SCIENTIFIQUE (CNRS), Paris (FR); UNIVERSITE DU MANS, Le Mans (FR)

(72) Inventors: Stéphane Campidelli, Saint Remy l'Honore (FR); Renaud Cornut, Chatillon (FR); Vincent Derycke, Montigny-le-Bretonneux (FR); Dominique Ausserre, Soulitre (FR); Manuel Ausserre, Lyons (FR)

(73) Assignees: COMMISSARIAT A L'ENERGIE ATOMIQUE ET AUX ENERGIES ALTERNATIVES, Paris (FR); CENTRE NATIONAL DE LA RECHERCHE SCIENTIFIQUE (CNRS), Paris (FR); UNIVERSITE DU MANS, Le Mans (FR)

( * ) Notice: Subject to any disclaimer, the term of this patent is extended or adjusted under 35 U.S.C. 154(b) by 0 days.

(21) Appl. No.: 16/093,125

(22) PCT Filed: Mar. 23, 2017

(86) PCT No.: PCT/EP2017/056982
§ 371 (c)(1),
(2) Date: Oct. 11, 2018

(87) PCT Pub. No.: WO2017/178209
PCT Pub. Date: Oct. 19, 2017

(65) Prior Publication Data
US 2019/0170787 A1     Jun. 6, 2019

(30) Foreign Application Priority Data

Apr. 13, 2016 (FR) ..................... 16 53247

(51) Int. Cl.
*G01Q 30/02* (2010.01)
*G01Q 60/60* (2010.01)
(Continued)

(52) U.S. Cl.
CPC .......... *G01Q 30/025* (2013.01); *G01Q 60/60* (2013.01); *G02B 21/32* (2013.01); *H01L 21/187* (2013.01)

(58) Field of Classification Search
USPC ........................................ 850/51, 15, 14, 12
See application file for complete search history.

(56) References Cited

U.S. PATENT DOCUMENTS

2017/0173577 A1* 6/2017 Ausserre ................ C25D 5/024

FOREIGN PATENT DOCUMENTS

| WO | 2012/098349 A1 | 7/2012 |
| WO | 2015/055809 A1 | 4/2015 |
| WO | 2015/121462 A1 | 8/2015 |

OTHER PUBLICATIONS

O'Connell, et al., "Combined electrochemical-topographical imaging: a critical review". Anal. Methods, 7(17), pp. 6983-6999, 2015.
(Continued)

*Primary Examiner* — Kiet T Nguyen
(74) *Attorney, Agent, or Firm* — Baker & Hostetler LLP (57) ABSTRACT

A method is provided for positioning a micro- or nano-object on a planar support by displacement performed under visual control, wherein the micro- or nano-object is immersed in a transparent medium, called ambient medium, having a refractive index $n_3$; the planar support comprises a transparent substrate of refractive index $n_0 > n_3$ on which is deposited at least one optically absorbent layer, adapted to
(Continued)

behave as antireflection coating when it is lit at normal incidence with a lighting wavelength λ through the substrate; and the visual control comprises the lighting of the micro- or nano-object at least with the wavelength λ through the substrate, and the observation thereof also through the substrate. A method to scanning probe microscopy and to the assembly of nanostructures is provided.

17 Claims, 6 Drawing Sheets (51) Int. Cl.
*H01L 21/18* (2006.01)
*G02B 21/32* (2006.01)

(56) References Cited

OTHER PUBLICATIONS

Britnell et al. "Strong Light-Matter Interactions in Fleterostructures of Atomically Thin Films", Science, vol. 340, pp. 1311-1314, 2013.
Georgiou, et al. "Vertical Field Effect Transistor based on Graphene-WS2 Heterostructures for flexible and transparent electronics", Nature nanotechnology, 8(2), pp. 100-103, 2013.
Ausserré, et al., "Absorbing Backside Anti-reflecting Layers for high contrast imaging in fluid cells", (No. arXiv: 1405.7672), (2014).
Ausserré, et al.,"Anti-Reflecting Absorbing Layers for Electrochemical and Biophotonic Applications", Journal of Nanomedicine and Nanotechnology, vol. 05, No. 04, Jul. 21, 2014.

* cited by examiner

FIG.8E

METHOD AND APPARATUS FOR POSITIONING A MICRO- OR NANO-OBJECT UNDER VISUAL OBSERVATION

CROSS-REFERENCE TO RELATED APPLICATIONS

This application is a National Stage of International patent application PCT/EP2017/056982, filed on Mar. 23, 2017, which claims priority to foreign French patent application No. FR 1653247, filed on Apr. 13, 2016, the disclosures of which are incorporated by reference in their entirety.

FIELD OF THE INVENTION

The invention relates to the positioning of a micro- or nano-object above a planar support, performed under visual control. It relates to the field of nanotechnologies and applies, in particular, to local probe microscopy (and more particularly to electrochemical microscopy) and to nanofabrication.

BACKGROUND

A "micro-object" should be understood to be any object having at least one dimension less than or equal to 10 µm. A "nano-object" should be understood to be any object having at least one dimension less than or equal to 1 µm or even, according to a more restrictive definition, to 100 nm (in which case, between 100 nm and 1 µm, the object will be called "sub-micrometric").

Generally, it is difficult to position and accurately orient micro-objects, and even more so nano-objects, because the observation thereof is not easy. That stems both from their low intrinsic visibility and to the bulk due to the planar support and to the macroscopic elements (micromanipulators) allowing them to be manipulated.

One example of these difficulties is encountered in the field of scanning probe microscopy (SPM), which covers various techniques such as tunnel-effect microscopy (STM, for "Scanning Tunneling Microscopy"), atomic force microscopy (AFM) and electrochemical microscopy (SECM, from "Scanning Electro-Chemical Microscopy").

A scanning local probe microscope, or simply local probe microscope—explores a surface point by point along a line (position of the probe on an axis x), then line by line (position of the probe on an axis y, at right angles to the axis x), in order to produce an image $S(x,y)$, where S is a signal relating to an interaction between the probe and the surface. The nature of this interaction conditions the type of microscopy considered: in atomic force microscopy, the surface is observed by measuring the force between the probe and the surface; in scanning tunneling microscopy, it is observed using the measurement of the tunnel current; and in scanning electrochemical microscopy, the probe is immersed in an ion solution, and it is the current deriving from the electrochemical processes on the surface, in the solution or at the probe, which makes it possible to image the sample.

Whatever the technique used, the interaction is always greatly dependent on the distance h between the probe and the surface being explored. Moreover, with constant distance h, this interaction depends on at least one local property p of the surface (for example the conductivity in STM), so that the signal S is a function of x, y, h and p. A number of local properties can simultaneously affect the signal S (for example the local conductivity of the surface and the Van der Waals interaction between the point of the STM and the surface), that can be taken into account with a vector notation p. Similarly, geometrical factors other than h can also affect S, and in particular the inclination of the axis of the probe relative to the normal to the surface, which is an element that is particularly important in the case of SECM. To take account of this, here again it is possible to use a vector notation, h. In total, the signal delivered by the point can be denoted $S(x,y, h, p)$.

Generally, an SPM microscope has two main operating modes:

In the first, called "constant distance", the height h is corrected during the scanning in order to keep the signal S constant, and the extracted information $h(x,y)$ describes the reliefs of the surface with a resolution which depends on the fineness of the point.

In the second, called "constant height", the probe is made to move in a plane $z(x,y)$ and every effort is made generally to keep this plane as parallel as possible to the surface of the sample so as to keep the height $h(x,y)$ approximately constant, and the variations of the signal S due to the other parameters are recorded, making it possible to map one or more properties $p(x,y)$ of the surface.

Since the interaction between the point and the surface depends on both h and p, the separation of the two sets of parameters is always difficult. One approach for overcoming this difficulty is to record not one but several measurements of S at each point (amplitude and phase in AFM, for example). To obtain these multiple measurements, one of the control parameters, such as, for example, the potential of the probe in electrochemical microscopy, must be varied at each point. For example, it is possible to vary the distance h between the point and the surface at each point x,y or modulate this distance at a frequency much greater than the scanning frequency. This approach is particularly difficult to implement in the case of SECM, because the measured quantity (an electrical current) is more sensitive to the properties of the surface and of the electrolyte studied than to the distance h, whereas, in most of the other SPM techniques, the measurement S depends very greatly on h and to a lesser extent on p.

It is therefore essential to be able to very accurately measure the point—surface distance, and do so independently of the signal generated by the probe, in order to be able to separate the information relating to the position of the probe from the information relating to the local interaction with the surface. Preferably, this measurement must also be rapid, especially if it has to allow for a servocontrol in order to perform a scan at constant distance.

As described above, it is also necessary to accurately determine the relative orientation of the end of the probe relative to its directions of displacement: the geometrical faults of the probes mean that there is always a difference of orientation between the axes of the displacement and the geometrical axes of the probe. In the particular case of SECM, where the probe usually has a flattened point, in the form of a disk, with a conductive region at its center, the inclination of the probe determines the minimum distance that can be reached between this conductive region and the surface, which in turn limits the quality of the signal acquired.

Thus, an effective implementation of different scanning probe microscopy techniques requires the accurate and rapid positioning of a nano-object (the point of the probe) relative to a planar surface. Currently, that is obtained by methods specific to each technique. In the particular case of SECM, these techniques are particularly complex to implement and do not give full satisfaction; on this, see the article by M. A. O'Connell and A. J. Wain "*Combined electrochemical-topographical imaging: a critical review*" Anal. Methods 2015, 7(17), 6983-6999.

There is therefore a need for a technique for positioning an SPM probe, and more particularly an SECM probe, which is simpler and more effective than the methods of the prior art, particularly with a view to servocontrol allowing a scan at constant height.

Quite similar problems arise in the implementation of other micro- or nano-analysis techniques (using, for example, nano-pipettes) and/or micro- or nano-fabrication techniques (using, for example, SECM probes to induce localized electrochemical reactions).

The problem of accurate positioning of a micro- or nano-object also arises in the field of the fabrication of vertical heterostructures of two-dimensional materials (2D), or "Van der Waals nanostructures", which are three-dimensional nanostructures obtained by stacking two-dimensional nano-objects, such as leaves of graphene or of similar materials, on a solid surface. Recent works have shown that such stackings can make it possible to obtain electronic or optoelectronic devices such as tunnel-effect diodes, vertical transistors, light emitters or detectors; see for example the article by L. Britnell et al. "*Strong Light-Matter Interactions in Heterostructures of Atomically Thin Films*", Science 2013, 340, 1311 and that of T. Georgiou et al. "*Vertical Field Effect Transistor based on Graphene-WS2 Heterostructures for flexible and transparent electronics*", Nature nanotechnology 2013, 8(2), 100-103. The stacking can be obtained by successive transfers: the leaves are first of all fixed to macroscopic pads which are positioned using micromanipulators, then released by chemically modifying or by dissolving the pads. The positioning is a critical operation, because the two-dimensional leaves are practically invisible which makes any visual control difficult. It is therefore necessary to proceed through trials, which is very ineffective and greatly limits the number of leaves that can be superposed. Contrary to the case of the scanning microscopy probes, where the most critical parameter is the probe—surface distance, in the case of the assembly of vertical heterostructures of 2D materials it is above all the position and the relative orientation (azimuth) of the nano-objects in the plane of the surface which has to be determined accurately. It is also very important to ensure the parallel alignment between the pads and the deposition surface, because even a small inclination can prevent contact between the leaves to be assembled.

The invention aims to remedy these drawbacks of the prior art, and more specifically to allow the positioning of a micro- or nano-object above a planar support by displacement performed under visual control.

According to the invention, this aim is achieved by virtue of the use of an optical technology known by the acronym BALM (Backside Absorbing Layer Microscopy), described in the following documents:

Ausserré, D., Amra, C., Zerrad, M., & Khachfe, R. A. (2014) "*Absorbing Backside Anti-reflecting Layers for high contrast imaging in fluid cells*" (No. arXiv: 1405.7672);
WO 2015/055809;
WO 2015/121462.

This technique consists in using a thin absorbent layer (often metallic), deposited on the surface of a transparent substrate, as contrast-amplifying antireflection layer. A sample deposited on the absorbent antireflection layer, even as thin as an atomic monolayer, appears with a high contrast when it is lit and observed through the substrate.

The article by D. Ausserré et al. "*Absorbing Backside Anti-reflecting Layers for high contrast imaging in fluid cells*", Journal of Nanomedicine and Nanotechnology, Vol. 05, No. 04, Jul. 21, 2014 also describes absorbent antireflection layers and their application to the amplification of contrast in fluid cells.

The present inventors have realized that the interferential phenomena causing the antireflection behavior of the absorbent layer are also affected by the presence of a micro- or nano-object situated in immediate proximity to said layer, but not necessarily in direct contact therewith, which allows for a visual control of the positioning of the micro- or nano-object above the layer. In fact:

The contrast-amplifying effect of the absorbent antireflection layer makes the object easily visible through the substrate, without the observation being disturbed by the presence of micromanipulators; that allows for its accurate positioning in the plane of the layer.

The image of the object observed through the substrate is very sensitive to the distance relative to the absorbent antireflection layer; that makes it possible to measure this distance, and therefore to accurately position the object in a direction at right angles to the layer.

In the case of a micro- or nano-object having a locally planar surface (nanodisk at the end of an SECM probe, leaf of two-dimensional material, etc.), the image observed through the substrate is also very sensitive to the orientation of this surface relative to the absorbent antireflection layer; that makes it possible to ensure the parallel alignment (or obtain a desired inclination) between the object and the layer.

The abovementioned document WO 2015/121462 discloses the combined use of an absorbent antireflection layer, of an optical microscope lighting and observing this layer through the transparent substrate and a scanning probe microscope arranged on the side of the layer opposite the substrate. This document concerns only the study of a chemical reaction both by optical means and by a localized electrochemical measurement; it does not concern using the microscope to facilitate the positioning of the local probe.

SUMMARY OF THE INVENTION

One object of the invention is therefore a method for positioning a micro- or nano-object on a planar support, comprising the displacement of said micro- or nano-object performed by means of a micromanipulator and under visual control, characterized in that:
said micro- or nano-object is immersed in a transparent medium, called ambient medium, having a refractive index $n_3$;
said planar support comprises a transparent substrate of refractive index $n_0 > n_3$ on which is deposited at least one optically absorbent layer, adapted to behave as antireflection coating when it is lit at normal incidence with a lighting wavelength $\lambda$ through said transparent substrate; and
the visual control comprises the lighting of said micro- or nano-object at least with said wavelength $\lambda$ at normal incidence through said transparent substrate and said optically absorbent layer, and the observation thereof by specular reflection also through said transparent substrate and said optically absorbent layer.

Another object of the invention is a method for fabricating a nanostructure by stacking two-dimensional nanostructures, comprising the positioning of said two-dimensional nanostructures by such a method.

According to a variant of the positioning method according to the invention, said micro- or nano-object can comprise at least one micro- or nano-electrode secured to a support allowing it to be manipulated. Another object of the invention is then a method for producing at least one micro- or nano-contact by deposition of at least one micro- or nano-electrode on the surface of a substrate, said deposition being performed by such a positioning method.

Yet another object of the invention is a local probe microscope comprising:

a planar support comprising a transparent substrate of refractive index $n_0$ on which is deposited at least one optically absorbent layer, adapted to behave as antireflection coating when it is lit at normal incidence with a lighting wavelength $\lambda$ through said transparent substrate, and when it is in contact, on the side opposite said substrate, with a transparent medium, called ambient medium, exhibiting a refractive index $n_3 < n_0$;

a local probe, arranged in proximity to a surface of said planar support;

an actuation system configured to displace said local probe over said planar support, at least in a direction at right angles to and in a direction parallel to said support;

characterized in that said local probe microscope also comprises an optical system configured to light said local probe at normal incidence at least with said wavelength $\lambda$ through said transparent substrate and said optically absorbent layer, and observe it by specular reflection, also through said transparent substrate and said optically absorbent layer; and in that said local probe microscope also comprises a servocontrol system configured to characterize the distance between the probe and the optically absorbent layer by analysis of an optical interference pattern or of a reflected light intensity observed through said substrate, and drive said actuation system to keep the measured distance equal to a setpoint.

Yet another object of the invention is an apparatus for assembling nanostructures comprising a planar support;

an actuation system configured to displace, as many times as necessary, over said planar support, a support, to which can be fixed a two-dimensional nanostructure;

characterized in that:

said planar support comprises a transparent substrate of refractive index $n_0$ on which is deposited at least one optically absorbent layer, adapted to behave as antireflection coating when it is lit at normal incidence with a lighting wavelength $\lambda$ through said transparent substrate, and when it is in contact, on the side opposite said substrate, with a transparent medium, called ambient medium, exhibiting a refractive index $n_3 < n_0$; and in that said apparatus also comprises an optical system configured to light said support at normal incidence at least with said wavelength $\lambda$ through said transparent substrate, and observe it by specular reflection, also through said transparent substrate and said optically absorbent layer.

Different embodiments of the invention are the subject of the dependent claims.

BRIEF DESCRIPTION OF THE DRAWINGS

Other features, details and advantages of the invention will emerge on reading the description given with reference to the attached drawings given by way of example, in which:

FIGS. 5A to 8E are optical images of micro- and nano-objects illustrating the technical results of the invention.

DETAILED DESCRIPTION

The figures are not to scale. In particular, the thickness of some layers (and in particular the absorbent antireflection layer) is very greatly enlarged in the interests of clarity.

Hereinbelow, a material will be considered absorbent to a wavelength $\lambda$ when the imaginary part of its refractive index at this wavelength is greater than or equal to 0.0001, preferably to 0.001, even more preferably to 0.01. Otherwise, it will be considered transparent.

Figure 1:
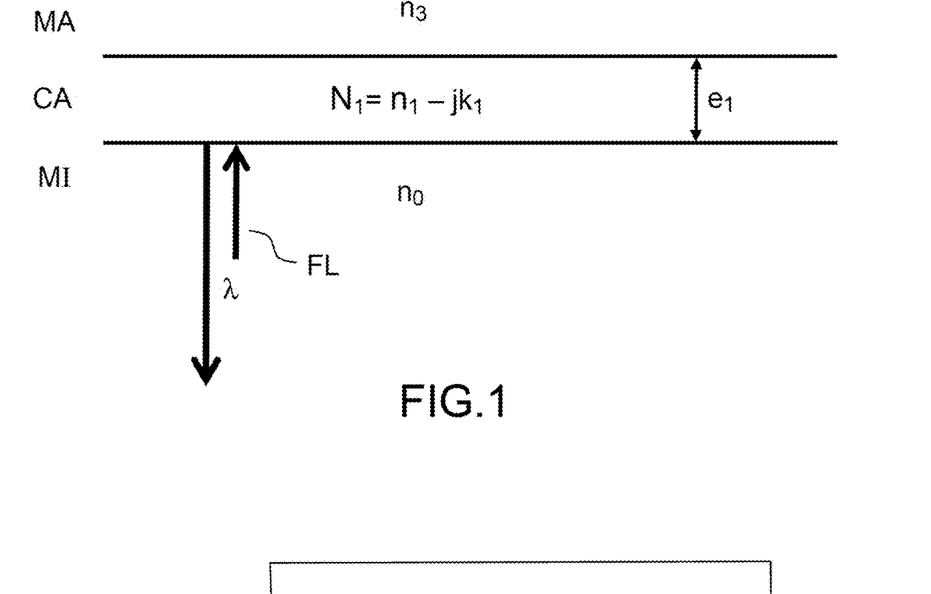
FIG. 1 illustrates the principle of the BALM technique, based on the present invention.

FIG. 1 provides a review of the theory of absorbent antireflection layers, already explained in the abovementioned international application WO 2015/055809. It illustrates a parallel light beam FL (that can be likened locally to a planar wave) that is also monochromatic at a wavelength (in vacuum) $\lambda$, at normal incidence on a structure consisting of: a semi-infinite medium called incident medium MI, from which the light beam originates, which is transparent and characterized by a real refractive index $n_0$; an absorbent layer CA of thickness $e_1$, characterized by a complex refractive index $N_1 = n_1 - jk_1$ ("j" being the imaginary unit); and a semi-infinite medium, called emergent or ambient medium MA, situated on the side of the layer opposite that from which the light originates, which is transparent and characterized by a real refractive index $n_3 < n_0$. The incident medium can in particular be a substrate, for example of glass, on which the layer CA is deposited.

The layer CA is dimensioned in such a way that the reflectance of the incident medium MI/layer CA/ambient medium MA altogether is as low as possible, and ideally nil. Any disturbance of the structure (the presence of a sample on the layer CA in the case of the known applications of the BALM technique; the immediate proximity of a micro- or nano-object in the case of the invention) provokes a marked increase in the reflected intensity, and is therefore detected easily.

The complex reflection coefficient of a structure of the type illustrated in FIG. 1 (layer of thickness $e_1$ contained between two semi-infinite media) is given by the Airy formula:

$$r_{013} = \frac{r_{01} + r_{13}e^{-2j\beta_1}}{1 + r_{01}r_{13}e^{-2j\beta_1}} \quad (2)$$

where $r_{ij}$ is the Fresnel coefficient at the interface i-j (i,j=0, 1 or 3, "0" corresponding to the incident medium, "1" to the layer CA and "3" to the emergent medium) and $\beta_1 = 2\pi n_1 e_1 \cos\theta_1/\lambda$ is the phase factor associated with said layer, $\theta_1$ being the refraction angle in the layer. Initially, a transparent layer of real index $n_1$ is considered, the generalization to the case of an absorbent layer being dealt with later. Still initially, an incidence is considered which need not be normal.

The Fresnel coefficients for the polarizations "p" (TM) and "s" (TE) are:

$$r_{ij}^{(p)} = \frac{(n_j\cos\theta_i - n_i\cos\theta_j)}{(n_j\cos\theta_i + n_i\cos\theta_j)} \text{ and } r_{ij}^{(s)} = \frac{(n_i\cos\theta_i - n_j\cos\theta_j)}{(n_i\cos\theta_i + n_j\cos\theta_j)}$$

The antireflection condition corresponds to $r_{013}=0$ which, in the case of transparent media (real indices), gives two families of solutions:
layers called "$\lambda/2$", for which $$e_1 = \frac{m\lambda}{(2n_1\cos\theta_1)}$$

where m is an integer, which exists only if $n_0=n_3$; and layers called "$\lambda/4$", for which $$n_1 e_1 = (2p+1)\frac{\lambda}{4}$$

(p integer).

In the case where the medium 1 (layer CA) is absorbent, its refractive index $N_1=n_1-jk_1$ is complex; the angle of refraction—that is then indicated by $\Theta_1$—and the phase coefficient—$B_1$—are also complex. In this case, $r_{013}=0$ dictates: $r_{01,s} \cdot r_{13,p} = r_{01,p} \cdot r_{13,s}$; this equality can be true only if one of the following three conditions: $\Theta_1=0$ (normal incidence), $N_1^2=n_0^2$ (no layer) or $n_0^2=n_3^2$ (incident and emergent media identical) is satisfied. Consequently, in the case of any extreme media, the antireflection condition can be satisfied only at normal incidence. Knowing that $r_{011,p}=-r_{01,s}$ and $r_{13,p}=-r_{13,s}$, the equation (2) becomes:

$$N_1^2 - j\frac{(n_3-n_0)}{\tan B_1}N_1 - n_0 n_3 = 0 \quad (3)$$

The equation (3) is transcendent and does not allow analytical solution. However, it is possible to find solutions corresponding to the extreme cases: layer produced in a greatly absorbent material and layer produced in a weakly absorbent material. It should be noted that a layer produced in a greatly absorbent but very thin material can, in fact, absorb less light than a layer produced in a weakly absorbent but thicker material.

In the case of a greatly absorbent material, it can be assumed that $e_1 \ll \lambda$ because the light would not be propagated through a thick layer of such a material; consequently, $|B_1| \ll 1$ and it is then possible to write, to the second order in $B_1$: $\tan B_1 \cong B_1 = \sqrt{n_3/n_0}(N_1/\sqrt{n_0 n_3})\delta_1$, where $\delta_1 = (2\pi n_0/\lambda)e_1$. It is useful to separate the real and imaginary parts of the equation, and to use the "reduced" variables $v_1 = n_1/\sqrt{n_0 n_3}$ and $k_1 = k_1/\sqrt{n_0 n_3}$. The equation (3) can then be written in the form of the following system:

$$v_1^2 = 1 + \kappa_1^2 \quad (4a)$$

$$\delta_1 = \frac{\left(\frac{n_0}{n_3}-1\right)}{2v_1\kappa_1} \quad (4b)$$

Given that $\delta_1$ must be real and positive, the condition $n_0 > n_3$ ("inverted geometry") applies. By taking $n_0=1.52$ and $n_3=1.34$ which corresponds to the glass/water case commonly used in biophotonics—a thickness $e_1=(\lambda/2\pi)(n_0-n_3)/2n_1 k_1$ of the order of a nanometer is found, which confirms the initial hypothesis. It is interesting—and unexpected—that the equation (4a) tends to the conventional index condition when $\kappa_1$—and therefore $k_1$—tends toward zero. A comparison with numeric results makes it possible to check that the equation (4a), although derived in the hypothesis from a layer of greatly absorbent material, is approximately valid for any value of $k_1$. By contrast, the value of $e_1$ obtained from the equation (4b) does not tend toward $\lambda/4n_1$; consequently, the equation (4b) does not have general validity.

In the case of a weakly absorbent material, it is posited that $B_1 = \pi/2 - \varepsilon_1$ (where $\varepsilon_1$ is a complex variable), which implies:

$$\varepsilon_1 = \pi/2 - \sqrt{\frac{n_3}{n_0}}(v_1 - j\kappa_1)\delta_1.$$

It is then possible to write, to the second order in $\kappa_1$:

$$v_1^2 = 1 + \frac{\pi}{2}\sqrt{\frac{n_3}{n_0}}\left(\frac{n_0}{n_3}-1\right)\kappa_1 - 3\kappa_1^2 + o(\kappa_1^3) \quad (5a)$$

$$\delta_1 \cong \frac{\pi}{2}\sqrt{\frac{n_0}{n_3}}\frac{1}{v_1}\left\{1 - \frac{4}{\pi}\frac{\sqrt{n_0/n_3}}{(n_0/n_3-1)}\kappa_1 + \kappa_1^2 + o(\kappa_1^3)\right\} \quad (5b)$$

In practice, the equation (5a)—whose range of validity proves to be highly reduced—is of little interest because, as mentioned above, the equation (4a) constitutes a satisfactory approximation for any value of $\kappa_1$. By calculating the numeric solution of the equation 3, it is possible to verify that the solution obtained for $\kappa_1$ that is high does not constitute an acceptable approximation for $\kappa 1$ for $\kappa_1$ that is small. By contrast, there is a semi-empirical equation which proves satisfactory in all the cases and which is given by the equation 6b below; the equation 6a is simply the equation 4a which, as has been shown above, can be considered general and used in place of 5b even for $\kappa_1$ that is small:

$$v_1^2 = 1 + \kappa_1^2 \quad (6a)$$

$$\delta_1 \cong \frac{(n_0/n_3-1)}{2v_1\kappa_1}\left[1 - e^{-\frac{\kappa_1}{k}}\right]. \quad (6b)$$

where $K = \{[\pi/(n_0/n_3-1)]\sqrt{n_0/n_3}\}^{-1}$

In practice, although being less constraining than the condition 1a which applies to the transparent anti-reflection layers, the condition 6a remains highly constraining. In practice, it is often possible to simply satisfy only the condition 6b exactly or approximately, for example with a tolerance on $e_1$ of the order of $\lambda/200$, even $\lambda/100$, even $\lambda/20$, even $\lambda/10$; in terms of $\delta_1$ that is reflected by a tolerance of the order of 0.005, even 0.01, even 0.05, even 0.1.

It is therefore particularly useful to introduce a hierarchy between the conditions 6a and 6b, which is justified by the following analysis:

The destructive interference between the beams reflected by the two surfaces f' an absorbent antireflection layer results from two contributions:
i) the amplitude of the reflection coefficients of these two surfaces;
ii) the phase shift between the beams reflected by these two surfaces, to which the phase-shift difference on reflection by each of the two surfaces and the optical path which separates them contributes.

The equation 6a translates the fact that the amplitude of the reflection coefficients is identical: the equation 6b translates the fact that the emergent beams are in phase opposition.

If the two equations are simultaneously satisfied, the suppression is total.

If only the equation 6a is satisfied, the fluctuations of the intensity reflected by the layer with its thickness are maximal, which guarantees the possibility of a perfect suppression, but does not guarantee the suppression, or even a satisfactory suppression.

If only the equation 6b is satisfied, the suppression is not necessarily perfect, because the amplitudes reflected by the two surfaces can be different, but the thickness of the layer is such that the suppression is satisfactory because the optical path is set for these two reflections to be in phase opposition or "almost" in phase opposition. It will be possible to speak in this case of an anti-resonant layer. The word "almost" translates the fact that the deviations in the condition 6a affect the phases of the amplitudes reflected by the two surfaces, and that they affect them weakly. This is why it is more important to approximate the condition 6b than to approximate the condition 6a. In practice, the index $N_1=n_1-jk_1$ varies greatly with the wavelength $\lambda$ and the product $v_1\kappa_1$ runs through an interval [p1, p2]. It is therefore essential to choose the target wavelength for which the thickness of the layer is optimized. The variations of the product $v_1\kappa_1$ with the wavelength are sufficient to make up, through the choice of the working wavelength, the error made on the thickness by using the equation 6b with the target wavelength when the equation 6a is not borne out.

It is therefore particularly shrewd practice:
i) to approximate the condition 6a as far as possible (for example with a tolerance less than or equal to 20%, preferably less than or equal to 5%, and even more preferably less than or equal to 1%, for $n_1$ and $k_1$, but it will sometimes be necessary to accept higher tolerances) given the constraints imposed upon the materials;
ii) to choose a target wavelength such that the corresponding product $v_1\kappa_1$ is situated toward the middle of the interval [p1, p2];
iii) to determine the reduced thickness $\delta_1$ of the layer by means of the equation 6b applied with this target wavelength;
iv) to choose the working wavelength which provides the best suppression.

Furthermore, the performance levels of a non-ideal absorbent antireflection layer, that is to say one that exactly or approximately bears out the condition 6b ("anti-resonant" layer) but not the condition 6a, for example made of metal, can be improved by depositing on top of it a small number (between 1 and 5) of leaves of a material of graphene type.

It should be noted that, although qualified as "absorbent", the contrast underlayer should not necessarily be composed of a strictly absorbent material: as a variant, it can be a layer composed of a diffusing material, the diffusion "imitating" the absorption and also being capable of being modeled by a complex refractive index. Thus, the expression "optically absorbent layer" generally denotes any layer produced in a material, absorbent or diffusing, that can be characterized by a complex refractive index with a not-inconsiderabe imaginary part (for example greater than or equal to 0.0001, preferably 0.001, even more preferably 0.01).

The absorbent antireflection layers used in the invention typically have a thickness less than or equal to 100 nm, and preferably to 40 nm.

The use of an absorbent antireflection layer to assist in the positioning of a micro- or nano-object is particularly advantageous, compared to the use of a conventional dielectric antireflection layer, for at least two reasons:
as has been explained above, the absorbent nature of the antireflection layer makes it possible to relax the constraints on its refractive index;
whether for the acquisition of SPM images or for the assembly of nanostructures, the positioning of a micro- or nano-object often has to be done on metal surfaces, which are compatible with the BALM technology but not with other observation techniques such as direct viewing through a reversed optical microscope.

Figure 2A:
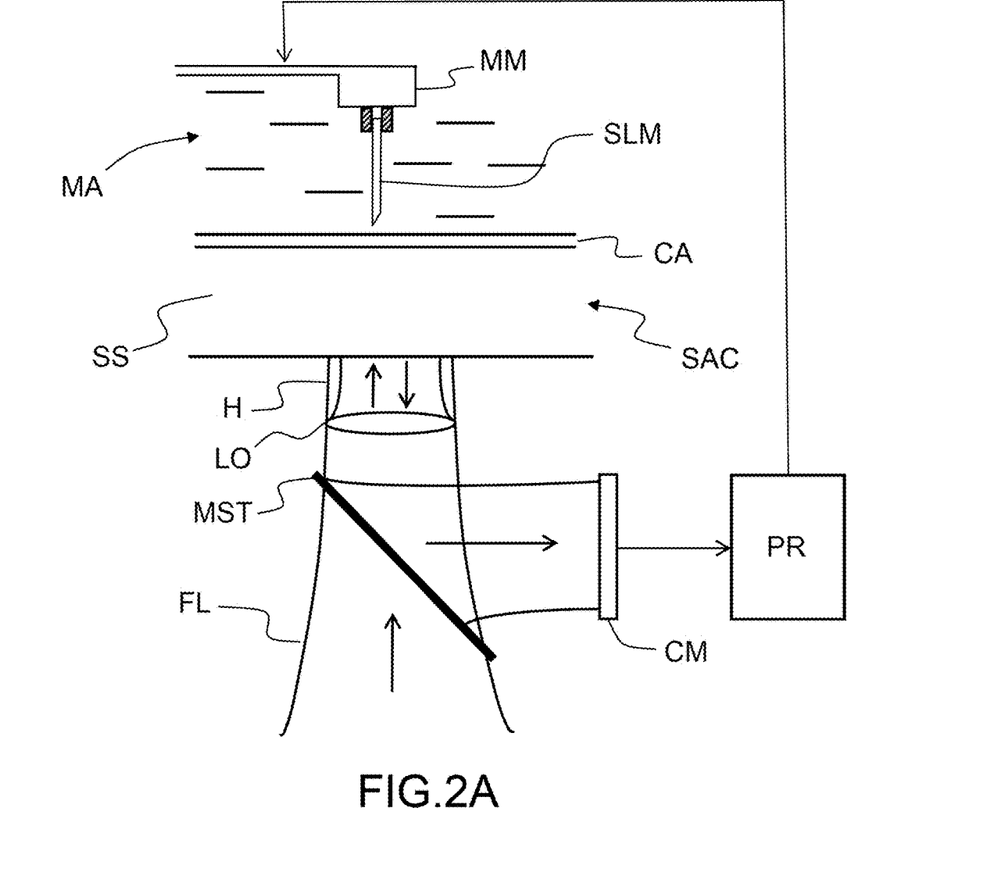
FIGS. 2A and 2B schematically illustrate the application of a method according to an embodiment of the invention to the positioning of a scanning microscopy local probe.

FIG. 2A represents a scanning probe microscope comprising a probe SLM that can be displaced in three spatial dimensions by an actuation system, or micromanipulator, MM. It can for example be an electrochemical microscope (SECM), in which case the probe SLM can, for example, take the form of a glass capillary surrounding a metal nano-electrode and having an end surface in the form of a disk exposing, at its center, said nano-electrode. The probe SLM can also take the form of a glass capillary containing, in its lumen, an ion solution. It will then be a nanopipette which can be used to deliver a solution containing different chemical species, or to detect a local electrochemical behavior. When the solvent in the nanopipette is not miscible with the solvent surrounding the nanopipette, the term ITIES then applies, which stands for "interface between two immiscible electrolyte solutions". The micromanipulator MM is configured to displace the probe SLM over the surface of a contrast-amplifying support SAC comprising a transparent substrate SS, for example made of glass or transparent plastic such as a polycarbonate or a polystyrene, on which is deposited an absorbent antireflection layer CA. The layer CA is in contact with an ambient medium MA in which the probe SLM is immersed; it will for example be able to be an electrolytic solution. The assembly comprising substrate SS, layer CA and medium MA forms a system of the type described above with reference to FIG. 1, the substrate SS acting as incident medium MI.

The substrate is lit at normal incidence (more specifically, by a cone of light about the normal) by a light beam FL which is, in the example considered here, a laser beam with Gaussian profile, focused by an immersion objective LO at the level of the antireflection layer (the reference H denotes the drop of oil intended to avoid the reflections by the rear face of the substrate). It is in fact known that, in its focal region ("beam waist"), a Gaussian beam exhibits a planar phase front, and can therefore be likened locally to a planar wave (case considered in the preceding theoretical developments). A semi-transparent mirror MST deflects a portion of the light reflected by the substrate SS/absorbent layer CA/ambient medium MA assembly, to direct it toward a matrix sensor CM, linked to a processor PR ensuring a digital processing of the images acquired by the sensor CM. The nature of this processing will be discussed later.

Assuming an ideal dimensioning of the layer CA for a wavelength $\lambda$, a monochromatic lighting at this wavelength, in the absence of local probe SLM and assuming that the ambient medium MA extends to a macroscopic thickness, the SS/CA/MA assembly should not reflect light. The presence of the local probe SLM in proximity to the layer CA disrupts this situation of suppression of the reflection. Since the suppression is more often than not imperfect, the proximity of the probe can participate therein or alter it. The probe is therefore observed as a bright spot on a black background or as a dark spot on a less dark background. The intensity and the extent of this spot depend monotonically on the distance between point and surface. In practice, a non-monochromatic lighting will be used more often than not and the dimensioning of the antireflection layer will be approximate, but the result will remain qualitatively the same.

In the example of FIG. 2A, the lighting is produced in coherent light by means of a laser, but that is neither essential nor necessarily advantageous. In the case of coherent lighting, the use of a diffusing disk revolving on the incident laser beam makes it possible to eliminate the spurious interferences of speckle type. As a variant, it is possible to use a wide beam of parallel light, that is not necessarily coherent. The use of a linearly polarized lighting is not essential, but can improve the sensitivity to the inclination of the nano-object.

In most cases, a lighting cone will be used which has an aperture half-angle that can reach 60°, but often of the order of 20°-30° or less, centered around the direction of normal incidence or, in any case, including this direction. The use of an immersion objective is advantageous, but other optical lighting and image forming systems can be used.

Figure 2B:
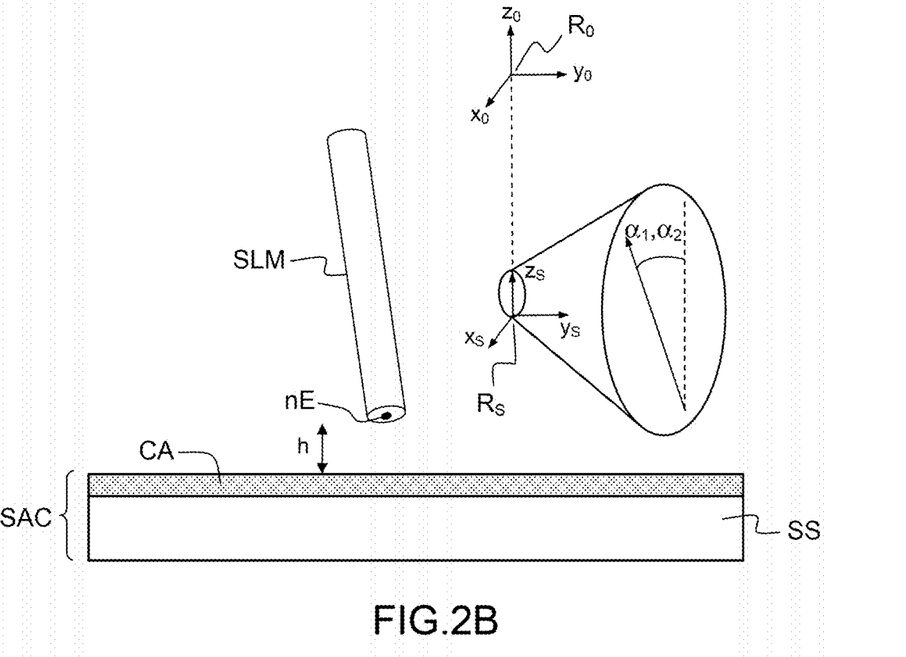

The observation of the probe SLM through the contrast-amplifying support SAC allows it to be positioned in the plane x-y parallel to the layer CA, but also allows the measurement (more generally, the characterization) of the distance h thereof to said layer and of its orientation, and consequently the control of these two parameters. FIG. 2B shows a detail view of a probe SLM for SECM, the end of which is located at a distance h from the surface of the absorbent antireflection layer CA. Generally, the probe is not perfectly at right angles to the surface; its orientation can be defined by two angles $\alpha_1$, $\alpha_2$, expressing the rotation between a reference frame $R_s$ integral to the probe (axes $x_s$, $y_s$, $z_s$) and a reference frame $R_0$ integral to the surface (axes $x_0$ and $y_0$, parallel to the surface, and normal axis $z_s$). The knowledge of the inclination is important for two reasons:

it has to be corrected as much as possible, in order to be able to maximize the approach of the nano-electrode nE at the center of the probe to the surface;

if the inclination is due to the poor orientation of the micromanipulator, a displacement of the probe in the plane $x_s$-$y_s$, nominally parallel to the surface but, in reality, inclined, will in fact induce a variation of the height h, necessitating a correction.

The approach of a scanning microscopy probe, such as an SECM probe, to the surface of the absorbent antireflection layer CA, comprises a first rough approach phase and a second fine approach phase.

In the rough approach, the BALM technique is not necessarily used. Simply, the probe SLM is observed through the support SAC, which is semi-transparent, by means of the objective LO; the contrast amplification due to the BALM technique is really exploited only if the point of the probe is very small (nanometric) or if its index is very close to that of the ambient medium, for example in the case or the probe is a PDMS pad or a pipette and the index of the liquid is high (but less than that of the support).

By focusing alternately on the layer CA and on the probe SLM it is possible to estimate their distance with a maximum accuracy which is defined by the depth of field of the objective—typically 500 nm in the case of a wide field microscope and 100 nm in the case of a confocal microscope.

Once the point of the probe has approached the layer CA to a distance of a few hundreds or tens of nanometers at the most, the near field interactions between the point and the absorbent layer begin to affect the operation of the BALM technique. What is observed via the objective LO is not a simple image of the point, but an interference pattern whose form, intensity and, if the lighting is not monochromatic, color, depend very greatly on the distance h. By comparing images of this pattern, acquired by the matrix sensor CM, with reference images corresponding to known values of h, it is possible to accurately measure this distance. The comparison can be performed by an operator, but is preferably performed automatically, by means of a conventional image processing algorithm (based, for example, on cross correlation calculations) implemented by the processor PR receiving as input signals from the sensor CM and storing the reference images in a memory. That presupposes a preliminary calibration step, which can be implemented as follows:

first of all, a probe is positioned a few hundreds of nanometers above the layer CA;

the surface of the layer is then approached step by step, with steps of known amplitude, and an image of the BALM interference pattern (reference image) is acquired for each position.

At a given moment, the probe touches the surface of the layer; at this point, it is known that h=0. Since the amplitude of the displacement step is known, it is possible to determine the value of h associated with each reference image.

As a variant, the reference images can be obtained by digital simulation.

In the case where the objective is not to measure but simply to keep the distance h constant, it is possible to exploit any monotonic characteristic of the local disturbance of the appearance of the surface imparted by the proximity of the point to achieve that, such as the position of an interference fringe, the diameter of an interference ring, a simple local variation of intensity or of color vertical to the probe or the diameter of the zone disturbed around this vertical.

"Interference pattern" should therefore be understood to mean any disturbance of the appearance of the surface induced by the proximity of the probe.

Any inclination of the probe relative to the normal to the layer CA induces a defect of parallel alignment between its planar end and said stump, which in turn is reflected by an asymmetry of the BALM interference pattern. A quantization of this asymmetry, by means of conventional signal processing techniques, makes it possible to estimate the angles $\alpha_1$, $\alpha_2$ which define the orientation of the probe (see FIG. 2B). The measurement of the angles $\alpha_1$, $\alpha_2$ can be made more accurate through the use of a linearly polarized lighting, and more particularly a lighting exhibiting a revolving polarization. On the other hand, it is not necessary to observe through a polarization analyzer.

One possible source of asymmetry of the BALM interference pattern can also be the defects of cylindricity of the probe. Thus, the asymmetries of the interference pattern that cannot be canceled by the changing of the angles $\alpha_1$, $\alpha_2$ will give information on the geometry of the probe itself. In the particular case of the microelectrodes, for example, it thus becomes possible to know different parameters associated with the geometry of the probe such as the form of the glass sheath or the eccentricity of the conductor relative to the glass. It is indeed important to know these parameters for a quantitative interpretation of the SECM measurements.

In the case where the objective is not to measure but simply to keep the inclination constant, it is also possible to exploit any monotonic characteristic of the local disturbance of the appearance of the surface imparted by a defect of parallel alignment to achieve that.

Thus, in some cases, it will not be necessary to measure, in a strict sense, the distance and/or the inclination of the point, and it will be possible to simply characterize them qualitatively.

The measurements of distance h and of inclination of the probe, or more generally their qualitative characterizations—can be used to implement a servocontrol of the micromanipulator MM, for example in order to produce a scan of the layer CA with h constant (or, more generally, with a distance h and/or an inclination of the probe according to a setpoint). FIG. 2A schematically illustrates such a servocontrol loop.

Figure 3:
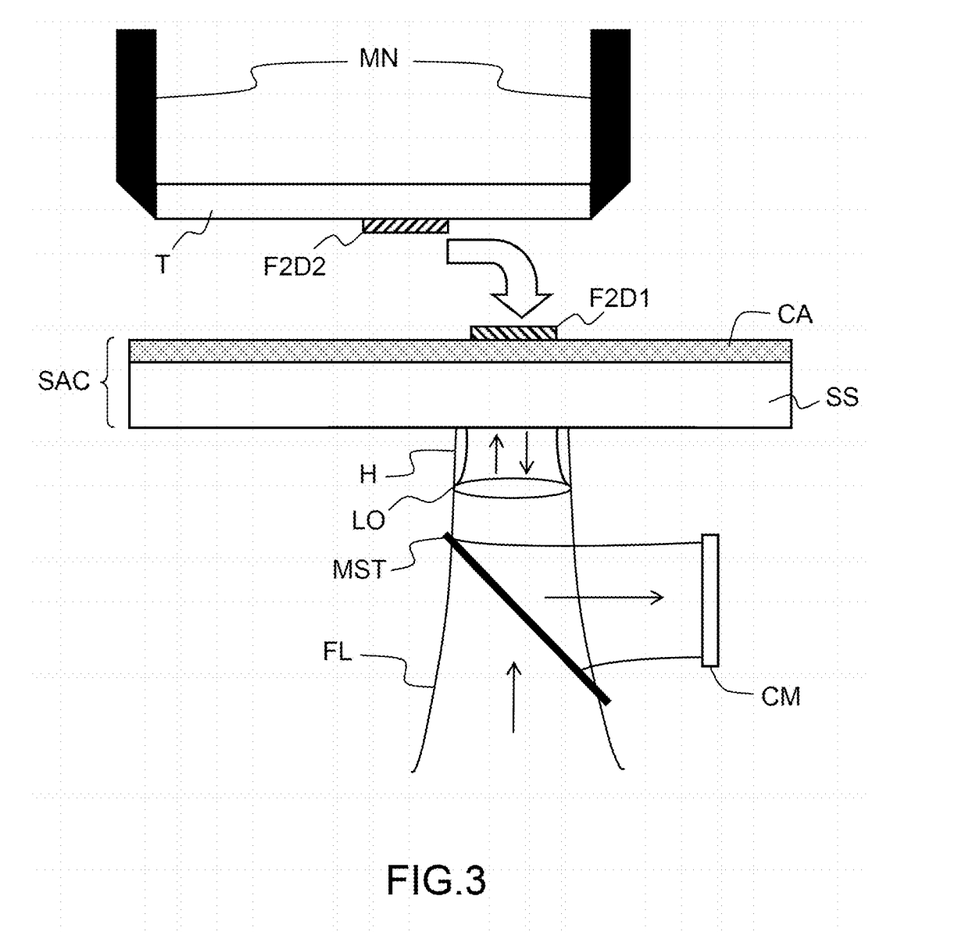
FIG. 3 schematically illustrates the application of a method according to an embodiment of the invention to the stacking of leaves of two-dimensional materials for the assembly of a vertical heterostructure of such materials.

FIG. 3 illustrates the application of the principle of the invention to the assembly of vertical heterostructures by stacking two-dimensional materials. The figure shows a contrast-amplifying support SAC, on the absorbent antireflection layer CA of which has been deposited a leaf F2D1 of a first two-dimensional material. Another leaf F2D2, of a second two-dimensional material, is fixed to a pad, for example of PDMS (polydimethylsiloxane), or else offered up to the layer CA on the surface of a bubble or of a drop held by a pipette. In these two cases, a simple contact of the pad or of the bubble with the surface is often sufficient to drop (deposit) the leaf. In other cases, the dropping of the leaf will require an appropriate pad, for example a soluble pad made of KCl. A micromanipulator MM laterally displaces the pad to position the leaf F2D2 vertically above F2D1, then approaches the surface of the support to bring the two leaves into mutual contact. An observation by BALM, performed using an optical system of the type described above with reference to FIG. 2A, makes it possible to guide this displacement by making the leaves visible.

In the case where the object to be positioned (the leaf F2D2) does not have a circular symmetry, the technique according to the invention also makes it possible to determine—and control, using a suitable micromanipulator—the orientation thereof in the plane (azimuth).

As in the case of a microscopy probe SPM, described above, an appropriate calibration makes it possible to measure the distance and the inclination between the leaf F2D2 and the layer CA. In this case also, it is possible to implement a servocontrol.

Figure 4:
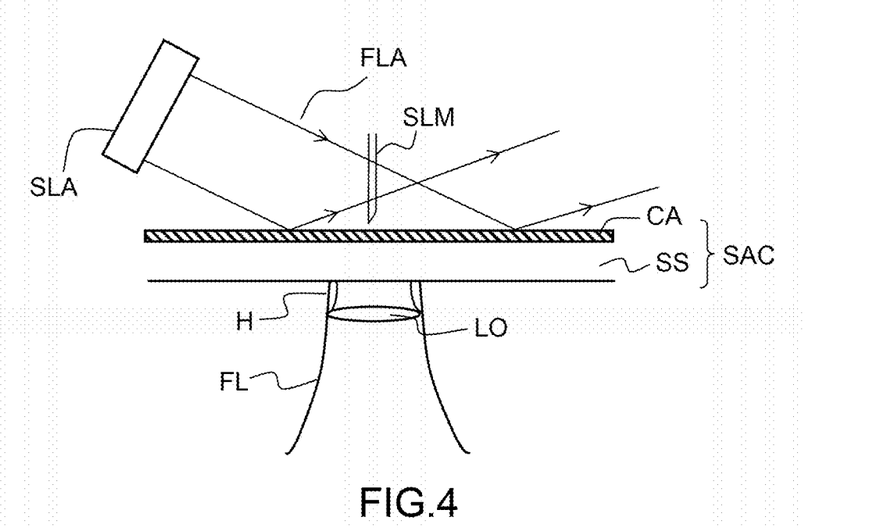
FIG. 4 illustrates a variant of the invention.

According to a variant of the invention, schematically illustrated in FIG. 4, it may also be useful to also provide an auxiliary light source SLA, situated on the same side of the contrast-amplifying support SAC as the object to be observed (in the example of FIG. 5, a local probe SLM). Preferably, the auxiliary light source SLA emits an auxiliary light beam FLA striking the surface of the support SAC with an angle of incidence that is not nil, preferably high (greater than 45 degrees), and even more preferably a glancing angle (greater than or equal to 60 degrees, even 70 degrees, which is typically beyond the aperture of a microscope objective). Preferably, however, the auxiliary light beam FLA is sufficiently inclined relative to the surface of the support SAC and sufficiently wide to light the object to be observed SLM both directly and by reflection on the surface.

This auxiliary lighting provides additional information which can be vital in assessing, in particular, the object-surface distance h. Indeed:

When the beam is not strictly parallel to the surface, the object lit by the beam FLA projects a shadow onto the layer CA; the distance between the foot of this shadow and the vertical of the object informs on the distance h.

Interference figures are generated between the light reflected by the surface then diffused by the object, on the one hand, and the light directly diffused by the object, on the other hand. These interference figures can be observed through said layer and are highly dependent on the distance h. This effect is greater if the beam FLA is temporally coherent, and particularly if the source SLA is a laser.

FIGS. 5A to 5D illustrate the application of a method according to the invention to tracking the displacement of an object above a contrast-amplifying support.

Figure 5A:
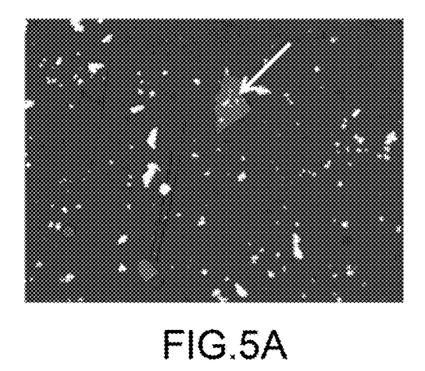
Figure 5B:
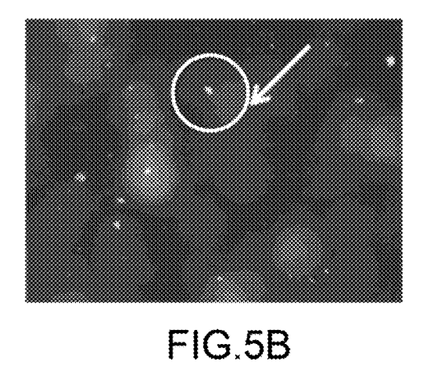
Figure 5C:
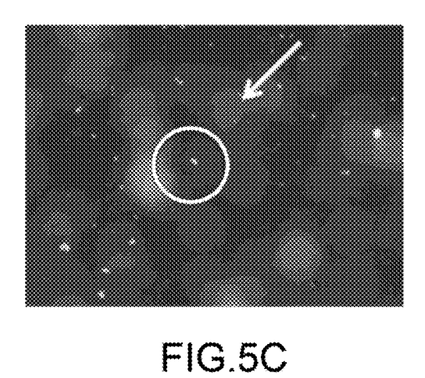
Figure 5D:
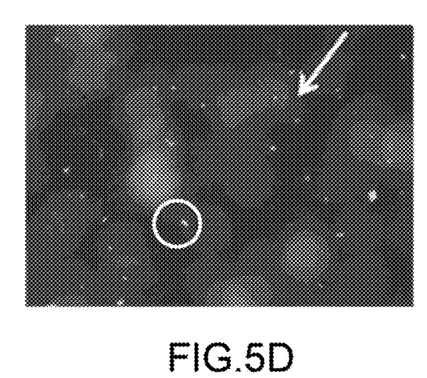

More specifically, FIG. 5A is an image obtained with focusing on the surface (containing exfoliated BN, that is to say a leaf of boron nitride, and exfoliated $MoS_2$) of the contrast-amplifying support; an arrow identifies a point of this surface, and serves as reference. The object to be displaced is not visible. FIGS. 5B, 5C and 5D are images obtained with focusing on the object (surrounded by a circle) during its displacement above the surface. The object (here exfoliated BN) is clearly visible, and can therefore be positioned accurately.

Figure 6A:
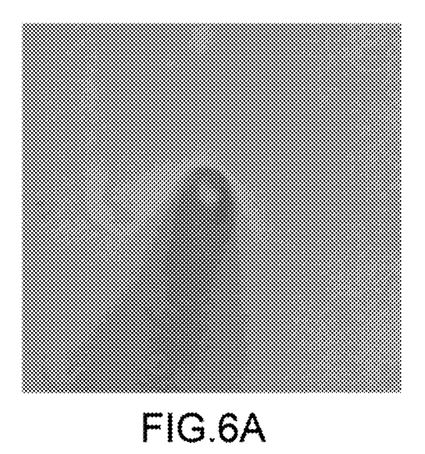
Figure 6B:
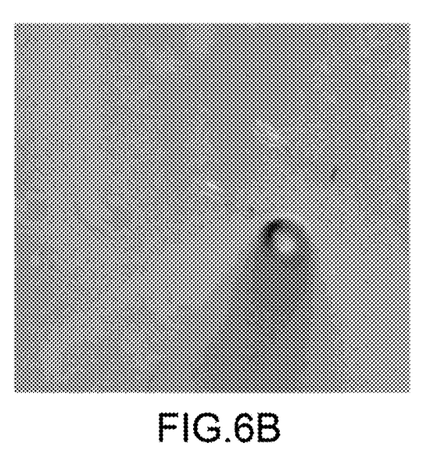

FIGS. 6A and 6B are images of a micropipette (diameter of the point equal to approximately 5 µm) seen through a contrast-amplifying support, corresponding to two different distances between the micropipette and the surface of the support (smaller in the case of FIG. 6B). The micropipette is not perfectly at right angles to the surface, and that is clearly visible in FIG. 6B.

Figure 7A:
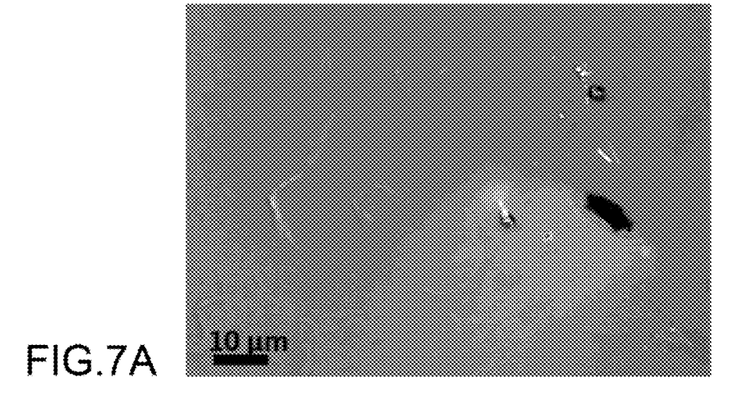
Figure 7B:
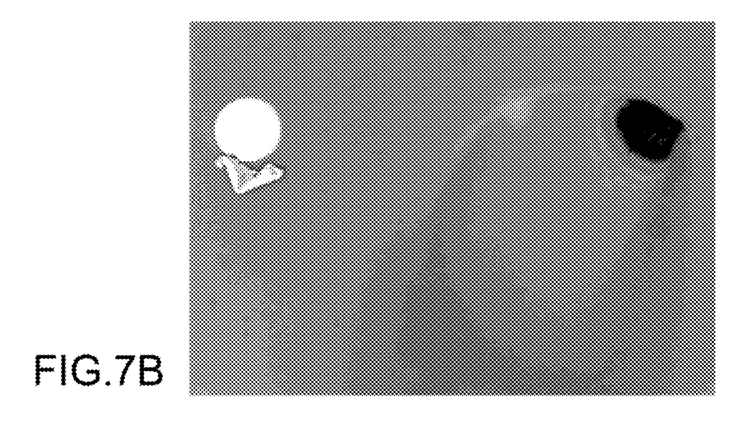
Figure 7C:
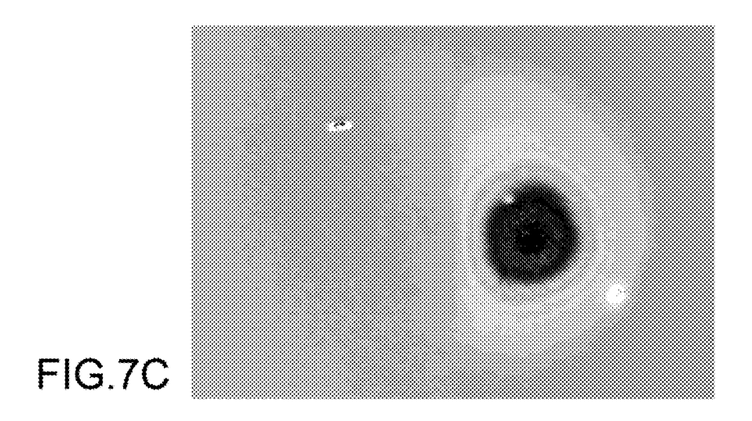

FIGS. 7A to 7C are images of a microelectrode (conductive wire of 10 µm diameter surrounded by a glass sheath) seen through a contrast-amplifying support. In the case of FIG. 7A, the microelectrode is very inclined relative to the normal to the surface (inclination greater than 25°); in the case of FIG. 7B, it has an intermediate inclination (lying between 10° and 15°) and in that of FIG. 7C it is substantially at right angles to the surface (angle with the normal less than 5°). That makes it possible to recognize the point at which the image observed through the substrate depends on the inclination of the microelectrode. In particular, the interference fringes are clearly visible and make it possible to evaluate the symmetry of the micro-electrode/surface association, both for the relative orientation of the two planes (surface of the microelectrode and surface approached) and for the cylindricity of the microelectrode.

Figure 8A:
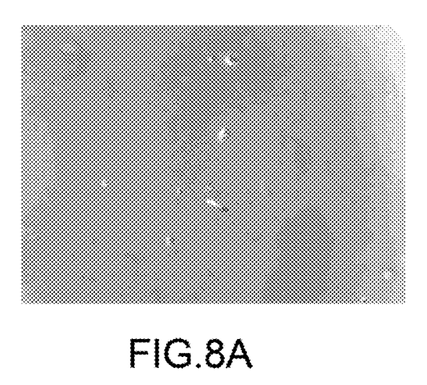
Figure 8B:
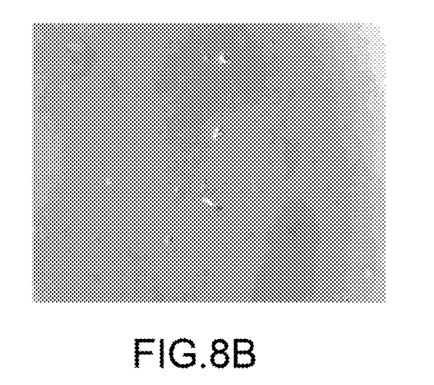
Figure 8C:
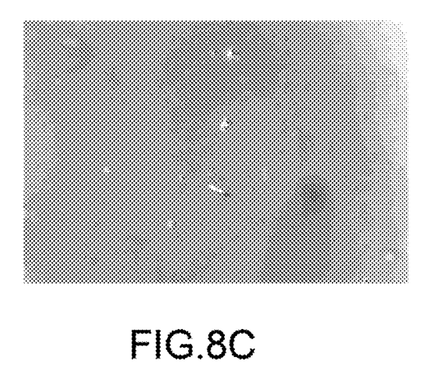
Figure 8D:
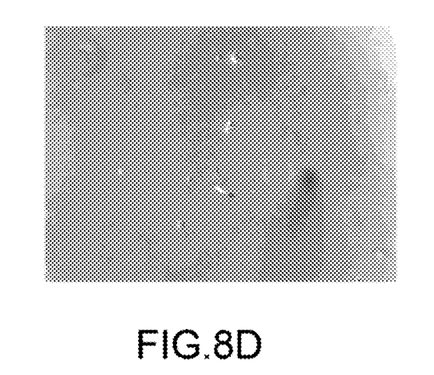
Figure 8E:
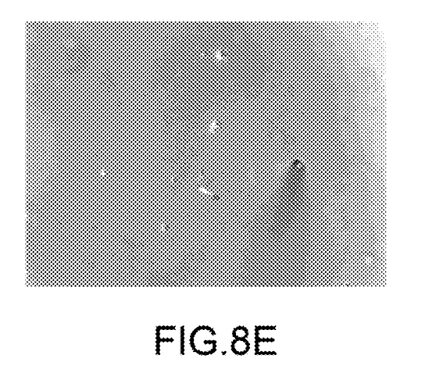

FIGS. 8A to 8E are images of the micropipette when it approaches the surface of the contrast-amplifying support, seen through said support with focusing on the surface. FIG. 8E corresponds to a situation of contact. The gradual changing of the image of the point of the micropipette makes it possible to accurately track its vertical displacement.

The invention has been described with reference to two particular applications, namely SPM microscopy and the assembly of two-dimensional materials, but it applies more generally to many cases where a micro- or nano-object has to be positioned accurately above a solid surface (or brought delicately into contact with this surface or with an object positioned on this surface) which is or can be covered by a layer of nanometric thickness composed of an optically absorbent material. For example, the invention applies to the observation, to the positioning and to the controlled deposition of micro- or nano-electrode (or assemblies of such electrodes borne by a support) on the surface of a substrate, for the production of micro- and nano-contacts in order to measure conductivities or local impedances, to fabricate electronic circuits—particularly in molecular electronics—artificial neural networks, electrochemical or electrokinetic devices, etc.

The invention claimed is:

1. A method for positioning a micro- or nano-object on a planar support, the method comprising:
   displacing said micro- or nano-object by means of a micromanipulator and under visual control; and
   immersing said micro- or nano-object in a transparent medium, called ambient medium, having a refractive index $n_3$,
   wherein said planar support comprises a transparent substrate of refractive index $n_0 > n_3$ on which is deposited at least one optically absorbent layer, adapted to behave as antireflection coating when it is lit at normal incidence with a lighting wavelength $\lambda$ through said transparent substrate, and
   the visual control comprises the lighting of said micro- or nano-object at least with said wavelength $\lambda$ at normal incidence through said transparent substrate and said optically absorbent layer, the observation thereof by specular reflection also through said transparent substrate and said optically absorbent layer and the characterization of either the distance between the micro- or nano-object and the optically absorbent layer or of the inclination of said micro- or nano-object relative to the optically absorbent layer by analysis of an optical interference pattern or of a reflected light intensity, observed through said substrate.

2. The method as claimed in claim 1, in which said optically absorbent layer is a conductive layer.

3. The method as claimed in claim 1, in which said lighting is a conical lighting about the normal to said optically absorbent layer.

4. The method as claimed in claim 1, in which the visual control also comprises the lighting of said micro- or nano-object by an auxiliary light source situated on the same side of said planar support as said micro- or nano-object.

5. The method as claimed in claim 1, in which said micro- or nano-object is a probe for local probe microscopy and its displacement comprises an approach of said probe to said optically absorbent layer.

6. The method as claimed in claim 5, also comprising the displacement of said probe in a direction substantially parallel to said optically absorbent layer, the distance between the probe and the layer being kept constant by a servocontrol mechanism using said visual control.

7. The method as claimed in claim 5, also comprising the displacement of said probe in a direction substantially parallel to said optically absorbent layer, the orientation of the probe relative to the layer being kept constant by a servocontrol mechanism using said visual control.

8. The method as claimed in claim 5, in which said probe is an electrochemical microscopy probe.

9. The method as claimed in claim 1, in which said micro- or nano-object is a two-dimensional nanostructure secured to a support allowing it to be manipulated.

10. A method for fabricating a nanostructure by stacking two-dimensional nanostructures, comprising the positioning of said two-dimensional nanostructures by a method as claimed in claim 9.

11. The method as claimed in claim 1, in which said micro- or nano-object comprises at least one micro- or nano-electrode secured to a support allowing it to be manipulated.

12. A method for producing at least one micro- or nano-contact by deposition of at least one micro- or nano-electrode on the surface of a substrate, said deposition being performed by a method as claimed in claim 11.

13. A local probe microscope comprising:
   a planar support comprising a transparent substrate of refractive index no on which is deposited at least one optically absorbent layer, adapted to behave as antireflection coating when it is lit at normal incidence with a lighting wavelength $\lambda$ through said transparent substrate, and when it is in contact, on the side opposite said substrate, with a transparent medium, called ambient medium, exhibiting a refractive index $n3 < n_0$;
   a local probe, arranged in proximity to a surface of said planar support;
   an actuation system configured to displace said local probe over said planar support, at least in a direction at right angles to and in a direction parallel to said support; wherein:
      said local probe microscope also comprises an optical system configured to light said local probe at normal incidence at least with said wavelength $\lambda$ through said transparent substrate and said optically absorbent layer, and observe it by specular reflection, also through said transparent substrate and said optically absorbent layer; and in that
      said local probe microscope also comprises a servocontrol system configured to characterize the distance between the probe and the optically absorbent layer by analysis of an optical interference pattern or of a reflected light intensity observed through said substrate, and drive said actuation system to keep the measured distance equal to a setpoint.

14. The local probe microscope as claimed in claim 13, in which said servocontrol system is also configured to:
   characterize the inclination of the probe relative to the optically absorbent layer by analysis of said optical interference pattern or of said reflected light intensity observed through said substrate;
   drive said actuation system to keep the measured inclination equal to a setpoint.

15. The local probe microscope as claimed in claim 13, of scanning electro-chemical microscopy (SECM) type.

16. An apparatus for assembling nanostructures comprising
   a planar support;
   an actuation system configured to displace, as many times as necessary, over said planar support, a support, to which can be fixed a two-dimensional nanostructure wherein:
   said planar support comprises a transparent substrate of refractive index no on which is deposited at least one optically absorbent layer, adapted to behave as antireflection coating when it is lit at normal incidence with a lighting wavelength $\lambda$ through said transparent substrate, and when it is in contact, on the side opposite said substrate, with a transparent medium, called ambient medium, exhibiting a refractive index $n3 < n_0$; and
   in that said
   apparatus also comprises an optical system configured to light said support at normal incidence at least with said wavelength $\lambda$ through said transparent substrate, observe it by specular reflection, also through said transparent substrate and said optically absorbent layer, and characterize either the distance between the two-dimensional nanostructure and the optically absorbent layer or of the inclination of said two-dimensional nanostructure relative to the optically absorbent layer by analysis of an optical interference pattern or of a reflected light intensity, observed through said substrate.

17. The apparatus for assembling nanostructures as claimed in claim 16, in which said support is adapted to allow the dropping of said nanostructure onto said support once positioned.

\* \* \* \* \*